United States Patent [19]

Witek et al.

[11] Patent Number: 5,256,588
[45] Date of Patent: Oct. 26, 1993

[54] METHOD FOR FORMING A TRANSISTOR AND A CAPACITOR FOR USE IN A VERTICALLY STACKED DYNAMIC RANDOM ACCESS MEMORY CELL

[75] Inventors: Keith E. Witek; Carlos A. Mazuré; Jon T. Fitch, all of Austin, Tex.

[73] Assignee: Motorola, Inc., Schaumburg, Ill.

[21] Appl. No.: 856,411

[22] Filed: Mar. 23, 1992

[51] Int. Cl.$^5$ .................. H01L 21/70; H01L 27/00
[52] U.S. Cl. .................. 437/52; 437/919; 437/203
[58] Field of Search .............. 437/47, 52, 60; 257/67-70, 301-306, 135-136, 263-267, 328, 334

[56] References Cited

U.S. PATENT DOCUMENTS

| | | | |
|---|---|---|---|
| 4,686,552 | 8/1987 | Teng et al. | 257/68 |
| 4,713,678 | 12/1987 | Womack et al. | 257/302 |
| 5,047,815 | 9/1991 | Yasuhira et al. | 357/26.3 |
| 5,055,898 | 10/1991 | Beilstein et al. | 357/23.6 |
| 5,073,515 | 12/1991 | Roehl et al. | 437/52 |
| 5,100,822 | 3/1992 | Mitani | 437/48 |
| 5,111,259 | 5/1992 | Teng et al. | 357/23.6 |
| 5,126,280 | 6/1992 | Chan et al. | 437/52 |

OTHER PUBLICATIONS

A Trench Transistor Cross-Point DRAM Cell, by W. F. Richardson et al., was published and presented at the IEEE IEDM Conference 1985, pp. 714-717.

*Primary Examiner*—Olik Chaudhuri
*Assistant Examiner*—H. Jey Tsai
*Attorney, Agent, or Firm*—Keith E. Witek

[57] ABSTRACT

A method for forming a transistor and a capacitor to provide, in one form, a DRAM cell (10). The capacitor of cell (10) is formed within a substrate (12). The capacitor has a first capacitor electrode (16) and a second capacitor electrode (20). A dielectric layer (18) is formed as an inter-electrode capacitor dielectric. A first transistor current electrode (36) is formed overlying and electrically connected to the first capacitor electrode (16). A channel region (38) is formed overlying the first transistor current electrode (36). A second transistor current electrode (40) is formed overlying the channel region (38). A conductive layer (30) is formed laterally adjacent the channel region (38) and isolated from the substrate (12) by dielectric layers (22 and 28). A conductive layer (30) functions as a gate electrode for the transistor and a sidewall dielectric (34) functions as a gate dielectric.

18 Claims, 6 Drawing Sheets

METHOD FOR FORMING A TRANSISTOR AND A CAPACITOR FOR USE IN A VERTICALLY STACKED DYNAMIC RANDOM ACCESS MEMORY CELL

FIELD OF THE INVENTION

The present invention relates generally to semiconductor technology, and more particularly, to transistor and capacitor structures used in semiconductors, such as memories.

BACKGROUND OF THE INVENTION

For decades, capacitors have been an important and irreplaceable circuit element used often in semiconductor circuit designs. For example, capacitors are widely used in applications such as a dynamic random access memory (DRAM), active and passive filters, analog-to-digital (A/D) and digital-to-analog (D/A) converters, operational amplifiers, radio and tuning circuits, oscillators and multivibrator circuits, time critical and time delay circuitry, noise reduction circuitry, charge pumps, power electronics, and many other diverse applications. A capacitor is defined in the simplest terms as a device consisting of two conducting surfaces separated by an insulating material. A capacitor stores electrical energy or charge, blocks the flow of direct current (DC), and permits the flow of alternating current (AC) depending essentially upon the capacitance of the device and the frequency of the incoming current or charge.

Capacitance, measured in farads, is determined by three physical characteristics: (1) a thickness or average thickness of the insulating material separating the two conducting surfaces; (2) how much surface area is covered by the two conducting surfaces; and (3) various mechanical and electrical properties of the insulating material and the two conducting surfaces. Achieving a high capacitance value while reducing substrate surface area is necessary for future generations of integrated circuits.

In the early development and marketing of the above mentioned technologies, parallel plate or parallel electrode capacitors were used as a capacitance structure. The parallel electrode capacitor is a capacitor which has a planar top conducting surface and a planar bottom conducting surface separated by a planar dielectric or insulator. Because the parallel electrode capacitor is completely planar, large surface areas of substrate material or substrate-overlying layers of material are consumed to achieve capacitance values in a useful nanofarad or picofarad range.

DRAM memory cells are electronic circuits that are used to store a bit of binary information. DRAM memory cell substrate area reduction is very critical in order to achieve device densities that allow for a DRAM integrated circuit with a large amount of memory cells. To achieve DRAM memory circuits with a million bits of storage or more, the industry developed a trench capacitor. The trench capacitor is formed by first etching a deep well, trench, or hole in a substrate surface or a surface overlying the substrate surface. A sidewall surface of the trench or hole is used to form a first electrode. The first electrode is covered by a dielectric material, and a second electrode is formed overlying the dielectric material. The second electrode usually completely fills the trench. Due to the fact that the sidewalls of the trench or hole provide surface area to the trench capacitor without consuming additional substrate surface area, the trench capacitor reduces capacitor substrate surface area and reduces the size of standard DRAM memory cells. Although the trench capacitor resulted in reductions in surface area, other advances in the technology are required to achieve further advances in DRAM technology.

In order to achieve further reduction in DRAM cell sizes, a fin capacitor was developed. The fin capacitor is formed by creating a first electrode overlying the substrate surface which resembles a vertically oriented comb-like structure. A central vertical pillar or spine of conducting material electrically connects to several horizontally positioned fins or planes of conducting material to form the comb-like structure. A second electrode is formed overlying the substrate in a vertical comb-like structure similar to the first electrode. The one difference between the two comb-like structures is that the fins of the first structure separate the fins of the second structure, or in other words, the fins from the two structures are intertwined thereby maximizing the surface area that the fins contribute to device capacitance. The fin capacitor device tended to be very complex to manufacture and also limiting due to its geometric shape and fabrication scheme.

In order to further improve area savings and reduce overlying layer complexity, a "double box" capacitor and other vertically raised capacitors were developed. The double box capacitor is created by lithographically forming a first box of conductive material with four sides. The four sides of this first box, which rise vertically above the surface of the substrate, surround a solid vertical lithographically-defined second box of conductive material. The first and second boxes are electrically connected to form a bottom electrode. An insulator covers the first and second boxes, and an overlying conductive layer forms the second capacitor electrode. In addition, structures similar to the double box capacitor have been taught.

Although DRAM cells may be manufactured using the capacitors mentioned above, the DRAM cells are: (1) limited largely by lithography; (2) in most cases lithographically intensive; (3) not space efficient enough for future memory generations; (4) likely to have topographical problems due to large differences in height across the capacitive devices; and (5) increasingly difficult to manufacture and mechanically unstable as topography increases.

Other devices, such as transistors, are area intensive and must also be reduced in surface area in order to improve DRAM cell circuit density. A surrounding gate transistor (SGT) is used to reduce transistor substrate surface area. The SGT uses a sidewall gate electrode and trench etch technology to reduce the gate electrode surface area.

SUMMARY OF THE INVENTION

The previously mentioned disadvantages are overcome and other advantages achieved with the present invention. In one form, the present invention comprises a capacitor and a method for forming the capacitor. The capacitor has a substrate which has a surface. A trench region is formed within the substrate and the trench region has a trench sidewall. A trench sidewall spacer is formed adjacent the trench sidewall. A conductive region is formed within the trench and laterally adjacent the trench sidewall spacer. The trench sidewall spacer is removed to expose the trench sidewall and a conductive region sidewall. A first capacitor electrode is formed laterally adjacent the trench sidewall and laterally adjacent the conductive region sidewall. A capacitor dielectric region is formed overlying the first capacitor electrode. A second capacitor electrode is formed overlying the first capacitor electrode. The second capacitor electrode is isolated from the first capacitor electrode by the capacitor dielectric region.

In another form, the present invention comprises a transistor and a method for forming the transistor. A base layer is provided and the base layer has a surface. A dielectric layer is formed overlying the base layer. The dielectric layer has an opening which exposes the surface of the base layer. A first current electrode is formed within the opening and electrically connected to the surface of the base layer. A channel region is formed overlying the first current electrode and overlying the dielectric layer. The channel region has a channel sidewall that overlies the dielectric layer. A second current electrode is formed overlying the channel region, and a sidewall dielectric layer is formed laterally adjacent the channel sidewall. A control electrode is formed laterally adjacent the sidewall dielectric layer.

In yet another form, the present invention comprises forming a dynamic memory cell with the capacitor and transistor taught herein. The dynamic memory cell has a substrate which has a surface. A trench capacitor is formed within the substrate and the trench capacitor has an exposed base layer. A transistor is formed overlying the surface of the substrate and substantially directly overlying the trench capacitor. The transistor has a first current electrode that substantially directly overlies a second current electrode. In one form, the transistor described above and the capacitor described above are used to form the dynamic memory cell.

The present invention will be more clearly understood from the detailed description below in conjunction with the accompanying drawings.

DESCRIPTION OF THE PREFERRED EMBODIMENT

Figure 1:
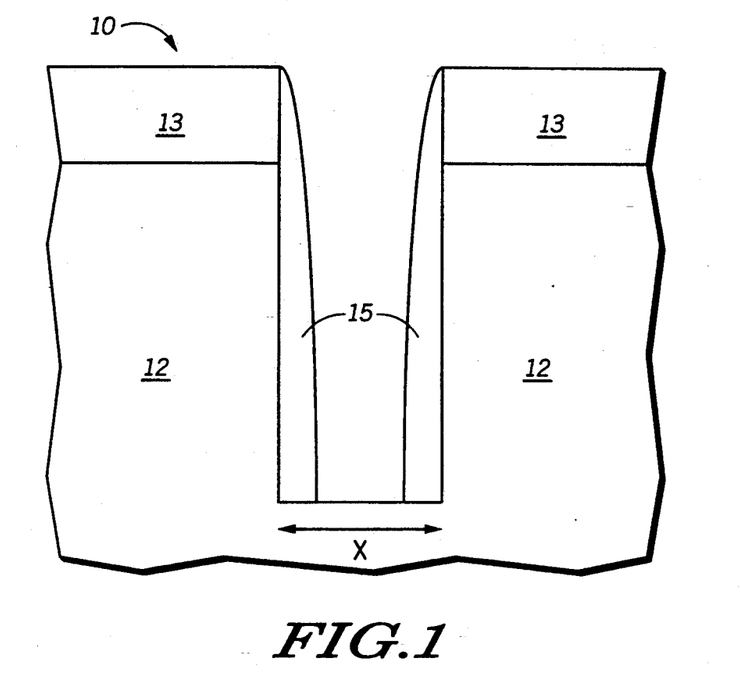
FIGS. 1-7 illustrate, in cross-sectional form, a method for forming a dynamic random access memory (DRAM) cell in accordance with the present invention.

Illustrated in FIG. 1 is a structure suitable for the formation of a dynamic random access memory (DRAM) cell 10. The memory cell 10 has a substrate 12 which has a surface. Substrate 12 may be made of silicon, gallium arsenide, silicon on sapphire (SOS), epitaxial formations, germanium, germanium silicon, and/or like substrate materials. Substrate 12 may include a conventional field oxide layer and like conventional layers. Preferably, the substrate 12 is made of silicon.

A masking layer 13 is formed overlying the substrate 12. Masking layer 13 is preferably a dielectric material such as silicon dioxide or a tetra-ethyl-ortho-silicate (TEOS) based oxide. The dielectric layers described herein may be wet or dry silicon dioxide ($SiO_2$), nitride, tetra-ethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride ($PSiN_x$), a combination of dielectric materials, and/or the like. Specific dielectrics are noted herein when a specific dielectric material is preferred or required.

A hole is photolithographically patterned and etched into the masking layer 13 in a conventional manner. The hole is preferably a contact hole or a lithographically defined hole of a smallest possible size. The hole which is formed in masking layer 13 exposes the surface of the substrate 12. A trench is etched into the substrate 12 via the exposed surface of the substrate 12. In FIG. 1, a dimension labeled "X" indicates a photolithographic width of the trench. A spacer 15 is formed laterally adjacent a sidewall of the trench and laterally adjacent a sidewall of the hole formed in masking layer 13. In a preferred form, spacer 15 is formed of a material that etches selective to the substrate 12 and the masking layer 13. For this reason, spacer 15 is typically nitride.

Figure 2:
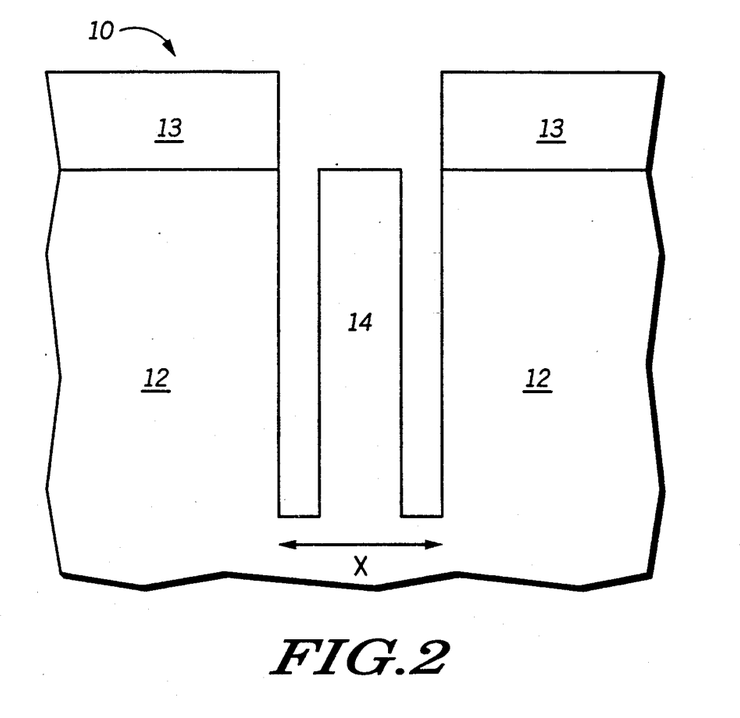

In FIG. 2, a conductive region 14 is formed within the trench and initially laterally adjacent the spacer 15 which is subsequently removed. The conductive region 14 is formed by either epitaxial growth, polysilicon deposition and recrystallization, plug/planarization technology, or a like process. Preferably, selective epitaxial growth is used to form conductive region 14. A bottom portion of the conductive region 14 is electrically connected to the substrate 12. The spacer 15 is etched away via a reactive ion etch (RIE), an isotropic etch, or the like. The removal of spacer 15 exposes a sidewall of the conductive region 14 and the trench sidewall. The removal of spacer 15 may etch region 14, thereby altering the shape of region 14 but not affecting the functionality of region 14. Optionally, a doped well region (not illustrated) may be formed within the substrate 12, surrounding the trench and/or surrounding the conductive region 14 for voltage biasing or isolation purposes.

Figure 3:
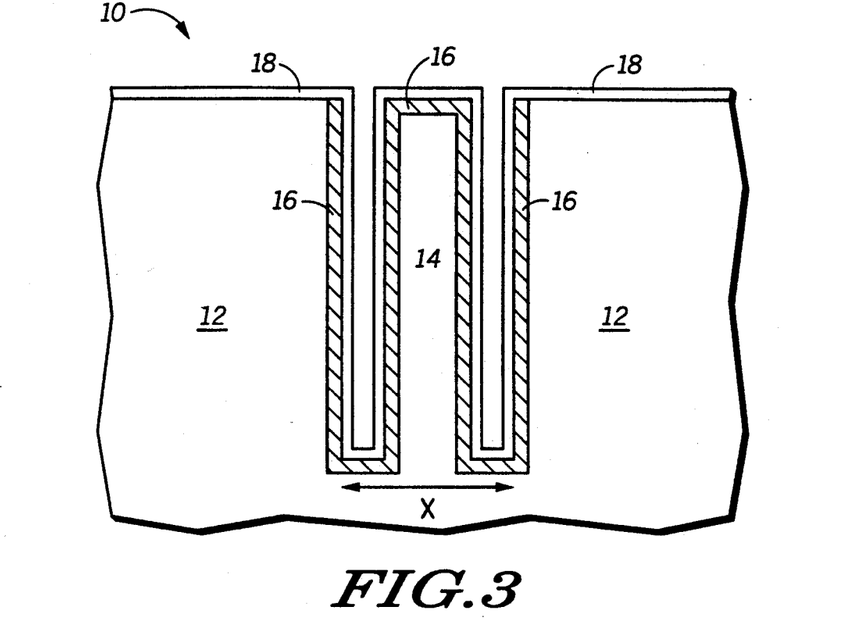

In FIG. 3, a first capacitor electrode 16 is formed adjacent the trench sidewall and adjacent the sidewall of conductive region 14. The electrode 16 is formed by either epitaxial growth, in-situ doped epitaxial growth, polysilicon deposition and etch techniques, diffusion technology, spacer technology, or the like. Optionally, the electrode 16 may be isolated from conductive region 14 and the substrate 12 by a dielectric layer (not illustrated). This dielectric layer isolation allows for more capacitance due to added capacitance to the substrate 12, but results in a structure that is more complex to process. An in-situ doped epitaxial silicon processing step is used to form the electrode 16 in a preferred form. A capacitor dielectric layer 18 is formed overlying the electrode 16. In a preferred form, the dielectric layer 18 is a silicon dioxide layer, an ONO layer, or a $Ta_2O_5$ layer formed via growth or deposition.

Figure 4:
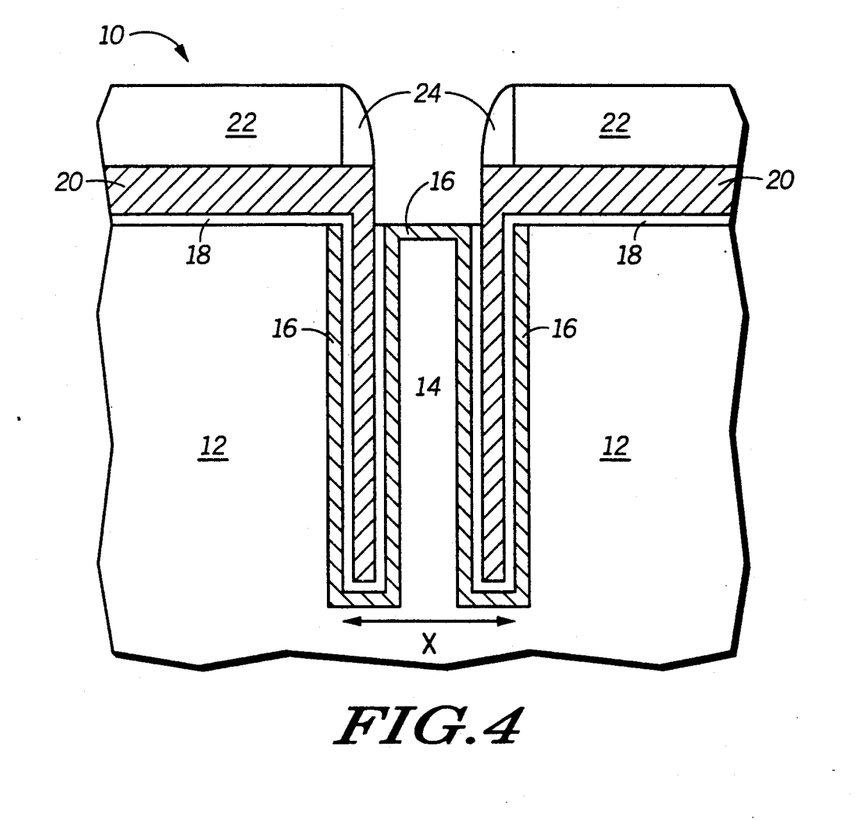

In FIG. 4, a conductive layer 20 is formed overlying the dielectric layer 18. Preferably, conductive layer 20 is a deposited conformal layer of polysilicon, but may be tungsten, salicide, epitaxial material, or a like conductive layer. The conductive layer 20 forms adjacent the dielectric layer 18, within the trench, and between the conductive region 14 and the trench sidewalls as illustrated. A dielectric layer 22 is formed overlying the conductive layer 20. A contact opening is formed within dielectric layer 22 wherein the opening overlies at least a portion of the trench. A spacer 24 is formed within the opening in dielectric layer 22. Dielectric layer 22 is preferable ONO, nitride, or a TEOS-based oxide. Spacer 24 is preferably nitride. A portion of conductive layer 20 is exposed by the opening in dielectric layer 22. The exposed portion of the conductive layer 20 and any other layers not being single crystalline which lie between conductive layer 20 and conductive region 14 are etched. This etching either exposes a top portion of the conductive region 14 or, as illustrated the etching exposes a top portion of electrode 16 if electrode 16 is made of single crystalline silicon.

Figure 5:
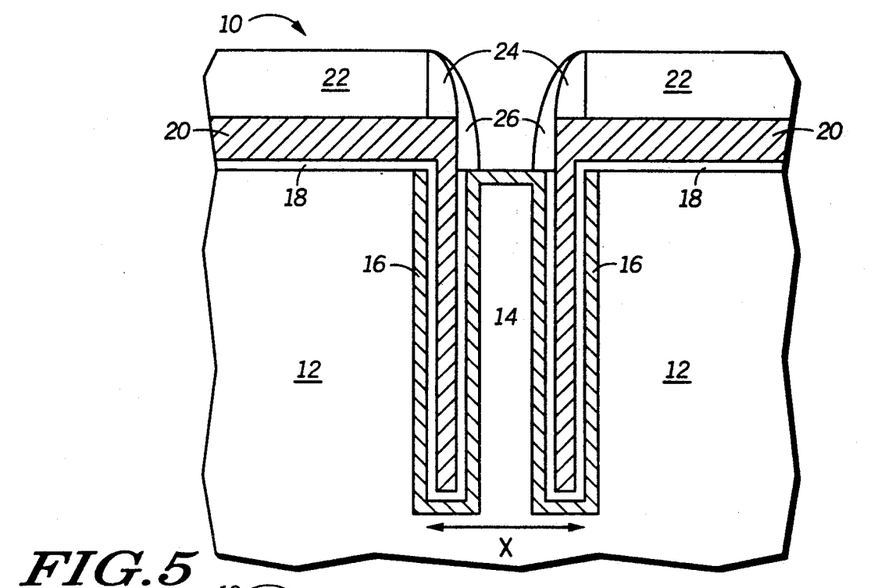

In FIG. 5, a spacer 26 is formed to isolate conductive layer 20 from conductive region 14 during subsequent processing. Preferably, the spacer 26 is nitride. Spacer 26 is also used to prevent layer 20 from epitaxially growing during subsequent processing.

Figure 6:
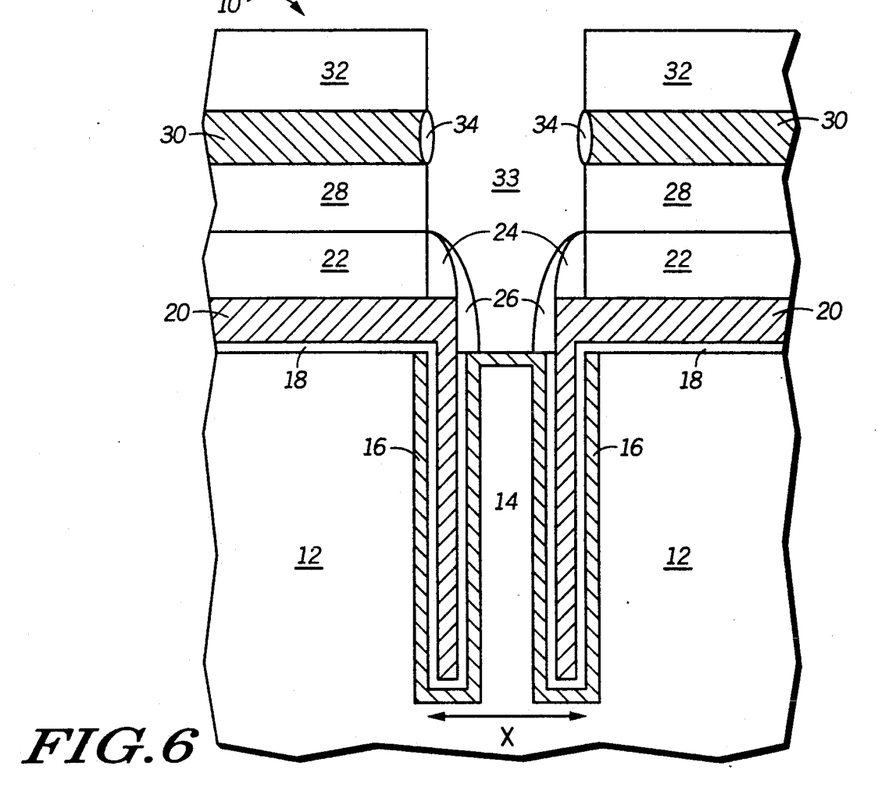

In FIG. 6, a dielectric layer 28, a control electrode conductive layer 30 and a dielectric layer 32 are respectively initially formed overlying the dielectric layer 22 and the spacer 26. Planarization of the layers 28, 30, and/or 32 is optional. Conductive layer 30 overlies the dielectric layer 28, and dielectric layer 32 overlies the conductive layer 30. A device opening 33 is formed through the dielectric layer 28, the conductive layer 30 and the dielectric layer 32. The device opening is referred to as an opening in some cases. The device opening 33 may be formed via conventional selective etch techniques or conventional non-selective etch processing. A sidewall of the dielectric layer 28 defines a first portion of the device opening 33. A sidewall of the control electrode conductive layer 30 defines a second portion of the device opening 33. A sidewall of the dielectric layer 32 defines a third portion of the device opening 33 wherein the first, second, and third portions of the device opening 33 are each horizontally self-aligned to each other.

The formation of the device opening 33 exposes a surface of the electrode 16 or the conductive region 14. The exposed surface of the electrode 16 or the conductive region 14 is referred to as a base layer or epitaxial "seed" layer. Optionally, the sidewall may be laterally recessed by an isotropic etch step during formation of the device opening 33. It should be noted that the dielectric layer 28 is optional. Dielectric layer 22 or spacer 26 may be used to replace the functionality of the dielectric 28 in some cases.

A sidewall dielectric 34 is formed laterally adjacent the sidewall of the conductive layer 30. The formation of the sidewall dielectric 34 may result in the formation of a dielectric region (not illustrated) overlying the conductive region 14. An RIE etch can be used to remove the dielectric region (not illustrated) overlying the conductive region 14 without affecting the sidewall dielectric 34. Recessing the sidewall of the conductive layer 30, as discussed above, further protects the sidewall dielectric 34 from the RIE etching. RIE etching and plasma environments are known to cause oxide damage in some cases. Therefore, the sidewall dielectric 34 may be optionally nitrided via $N_2$, $N_2O$, $NH_3$, or an equivalent nitrogen source. A nitrided dielectric resists plasma damage more than other dielectric materials.

Figure 7:
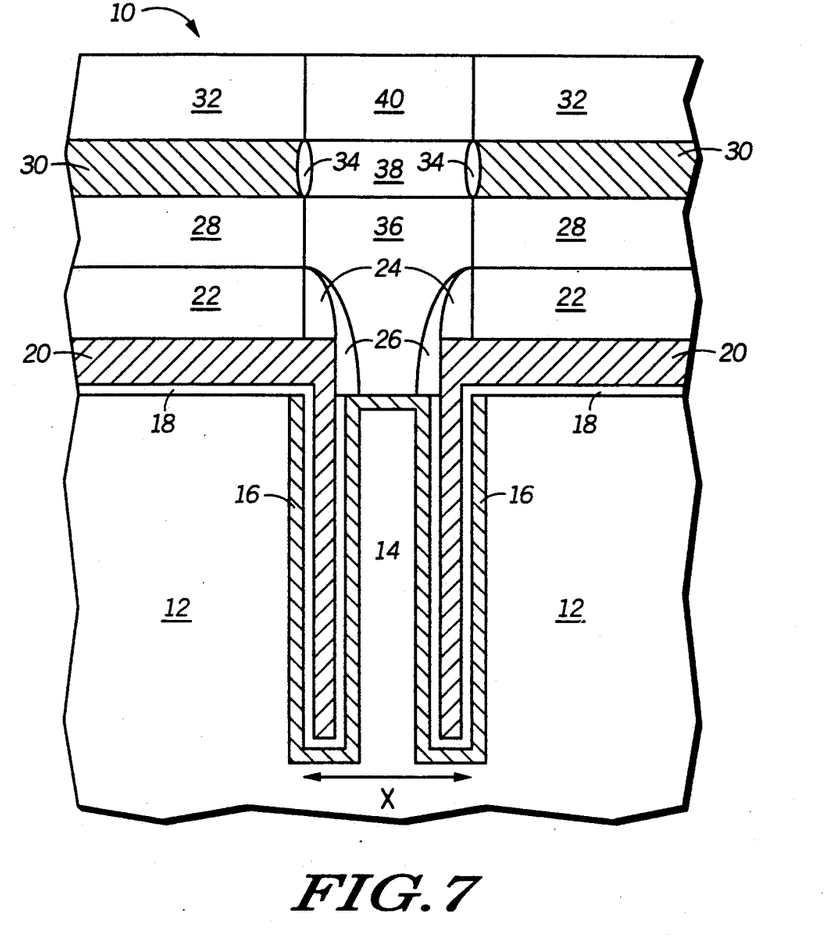

In FIG. 7, an epitaxial growth step is used to form a first current electrode 36 within the device opening and laterally adjacent the dielectric layer 28. The epitaxial material is grown from the exposed conductive region 14 or the exposed electrode 16. Therefore, the exposed conductive region 14 or the exposed electrode 16 is referred to as a base layer, seed layer, or a substrate material layer. Preferably, the electrode 36 and subsequent transistor electrodes are in-situ doped. In-situ doping is a doping technique that occurs during epitaxial growth. It should be apparent that other methods may be used, such as diffusion processing, ion implantation or the like. The electrode 36 is doped to a first conductivity type. The first conductivity type may be either N type or P type. The electrode 36 is physically and electrically connected to the capacitor electrode 16.

After the first current electrode is formed, a channel region 38 is epitaxially formed within the device opening and overlying the electrode 36. The channel region is positioned adjacent the sidewall dielectric 34. Therefore, the conductive layer 30 functions as a control electrode or a gate electrode and sidewall dielectric 34 functions as a gate oxide. The conductive layer 30 may either completely surround the channel region 38 or partially surround the channel region 38. The channel region 38 has a second conductivity type that is opposite the first conductivity type.

Epitaxial growth continues to form a second current electrode 40 which is within the device opening and laterally adjacent the dielectric layer 32. The electrode 40 is formed having the first conductivity type. The electrode 40 may either epitaxially grow out of the device opening or remain completely within the device opening. Electrical contact is made to the electrode 40 by an overlying conductive layer (not illustrated), such as metal, salicide, silicide, polysilicon, or the like.

Figure 8:
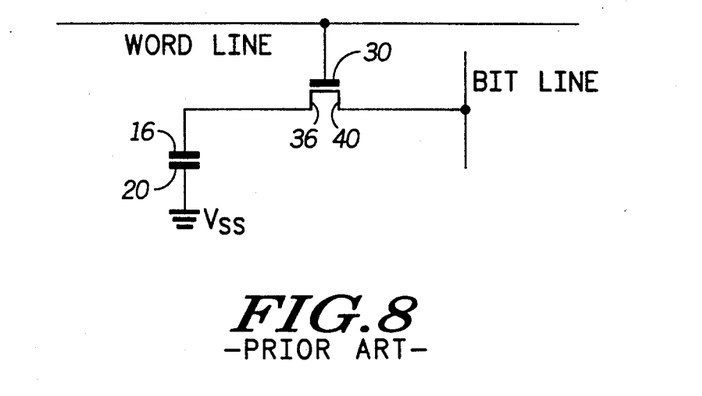
FIG. 8 illustrates in a schematic diagram a conventional DRAM cell circuit.

FIG. 8 illustrates a schematic of a known DRAM memory cell. Various nodes of the DRAM circuit in FIG. 8 are identically labeled to analogous regions or layers of FIG. 7 to better illustrate the DRAM cross section of FIG. 7. FIG. 8 illustrates that conductive layer 20 is connected to a ground potential. The electrode 16 is connected to the electrode 36 as illustrated in both FIGS. 7 and 8. Electrode 40 is connected to a conductive layer referred to as a "Bit Line" in FIG. 8. The control electrode conductive layer 30 functions as a "Word Line" as illustrated in FIG. 8. The result is a DRAM cell that has a small surface area. The dimension "X" in FIG. 7 represents the smallest photolithographic feature size possible for current photolithographic equipment. Therefore, dimension "X" is a dimension that is definitely sub-micron. DRAM cell 10, if lithographically limited to a dimension "X" of one-half of a micron (0.5 microns), has a surface area that is less than one square micron.

Figure 9:
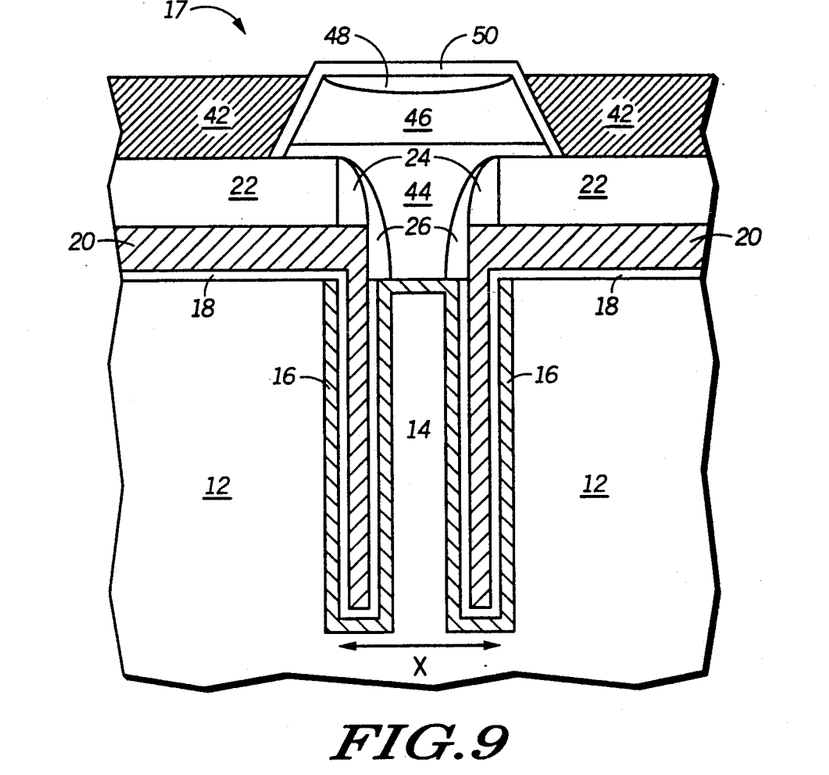
FIG. 9 illustrates, in cross-sectional form, an alternative DRAM cell in accordance with the present invention.

FIG. 9 illustrates a DRAM cell 17. Cell 17 illustrates an alternative transistor structure that may be used to form an inventive DRAM cell. The initial processing of cell 17 is identical to cell 10. Therefore, the steps illustrated in FIGS. 1-5 are performed before a transistor is formed in FIG. 9. Elements which are analogous between FIGS. 1-5 and FIG. 9 are identically labeled.

After the formation of dielectric layer 22 and the spacers 24 and 26 in FIG. 5, a first current electrode 44 is formed epitaxially. Electrode 44 is formed laterally adjacent spacer 26 and makes electrical contact to the conductive region 14. In order to achieve adequate electrode-to-gate overlap, electrode 44 is grown over the dielectric layer 22 and is preferably in-situ doped. Epitaxial growth, if performed on a clean surface with the proper sequence of steps, will form epitaxial regions that have no facets or a facet with a controlled angle.

A channel region 46 is epitaxially formed. The channel region 46 is formed overlying the electrode 44. The channel region 46 has the opposite conductivity type of the electrode 44 and is preferably in-situ doped. A dielectric layer 50 is formed overlying single crystalline epitaxial exposed surfaces of the channel region 46 and the electrode 44. The dielectric layer 50 is of good quality due to the fact that dielectric layer 50 is formed on single crystalline silicon. A conductive layer 42 is formed overlying both the dielectric layer 22 and the dielectric layer 50. The conductive layer 42 is planarized by chemical and/or mechanical polishing to expose a top portion of the dielectric layer 50 that overlies the channel region 46. The conductive layer 42 functions as a gate electrode.

An ion implantation step is used to form a second current electrode 48 that is self-aligned to the conductive layer 42. Electrical contact is made to the electrode 48 via conventional masking steps, etching steps, and conductive layer deposition or formation steps. The cell 17 functions in a manner similar to cell 10 of FIGS. 1-7.

It should be apparent that the transistor illustrated in FIG. 9 and the trench capacitor illustrated in FIG. 9 may be formed independently. The trench capacitor may be formed in isolation or for applications other than dynamic memory applications. In addition, the transistor may be formed overlying the substrate 12 by using the substrate 12 as a base layer. The transistor can therefore be formed in isolation or formed for use in applications other than dynamic memory applications.

Figure 10:
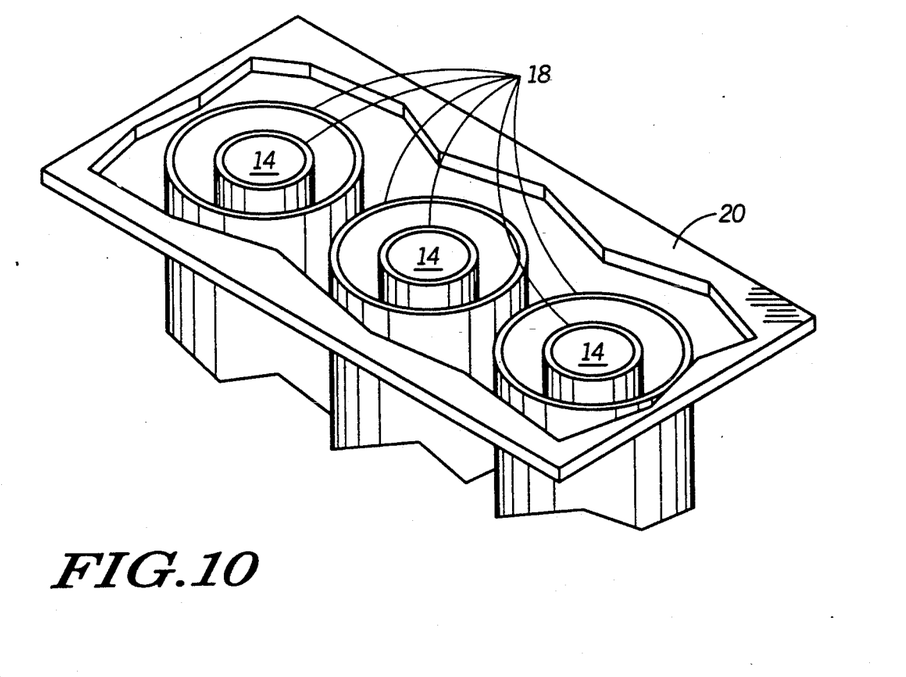
FIG. 10 illustrates a three dimensional perspective view of three trench capacitors connected in parallel and in accordance with the present invention.

FIG. 10 illustrates a method that can be used to provide greater capacitance to either the DRAM cell 10 or 17. Greater capacitance is achieved by simultaneously forming a plurality of trench capacitors and transistors. The plurality of transistors and capacitors may be arranged in one of several geometries, such as a triangular configuration, a rectangular configuration, a linear straight line configuration, or other geometries. Each capacitor and transistor is formed in accordance with either FIG. 7 or FIG. 9. Each of the capacitors in the plurality is electrically connected in parallel, and each of the transistors in the plurality is also electrically connected in parallel.

For example, in FIG. 10 three trench capacitors are simultaneously formed laterally adjacent each other in a linear straight line configuration. In order to correlate FIG. 10 to FIGS. 1-5, a few regions of the trench capacitors in FIG. 10 are identically labeled to FIGS. 1-5. The three trench capacitors are each formed simultaneously as illustrated in FIGS. 1-5. The conductive layer 20 connects the capacitors in parallel. Electrode 16 may also be electrically connected in parallel to each trench capacitor. Parallel connection of electrode 16 is not necessary due to the fact that the electrode 16 may not require parallel connection or may already be connected in parallel via a doped well region (not illustrated).

The formation of three trench capacitors results in the formation of three epitaxial seed regions. Each of the seed regions is referred to as conductive region 14. A transistor in accordance with the method described for FIG. 7 or a transistor in accordance with the method described for FIG. 9 is formed overlying each conductive region 14. These three transistors share a common gate electrode via conductive layer 30 of FIG. 7 or conductive layer 42 of FIG. 9. The transistors all share a common first current electrode and capacitor electrode connection due to the fact that each first electrode is connected to a respective electrode 16. The transistors share a common second current electrode due to the fact that each second current electrode of each transistor is electrically short circuited to each other. The second current electrodes are electrically short circuited via epitaxial growth or an overlying conductive layer (not illustrated).

In general, by forming a plurality of structures in accordance with either FIG. 7 or FIG. 9, the storage capacitance of a DRAM cell can be increased. In addition, the parallel capacitors result in the formation of parallel transistors that form one DRAM cell transistor with an improved aspect ratio. The improved aspect ratio provides greater electrical current drive for the DRAM cell. The added capacitance is achieved with a minimal loss in surface area due to the small surface area of DRAM cell 10 and DRAM cell 17.

Figure 11:
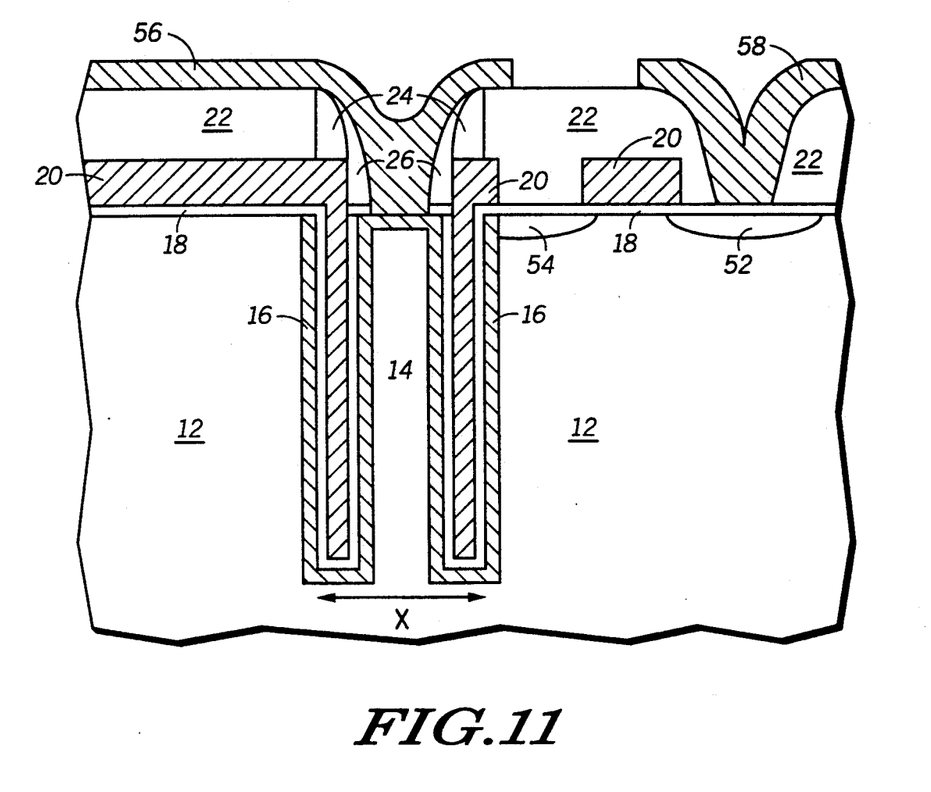
FIG. 11 illustrates, in cross-sectional form, another DRAM cell in accordance with the present invention.

FIG. 11 illustrates a DRAM structure wherein the inventive capacitor taught herein is electrically connected to a conventional planar transistor to form a DRAM cell. Elements of FIG. 11 that are analogous to elements of FIGS. 1-5 are identically labeled. An optional conductive layer 56 is used for providing increased capacitance or parallel capacitor connection if desired. Layer 56 can be used to form a second capacitor that overlies the trench capacitor. The second capacitor can be another trench capacitor, or known substrate-overlying capacitors such as a fin capacitor. Dielectric layer 18 functions as a gate dielectric for the transistor. A portion of conductive layer 20 functions as a gate electrode or a word line for the transistor. A source and drain are formed via the diffusions 54 and 52. A channel region separates the source and drain. A bit line is formed via conductive layer 58. Therefore, FIG. 11 illustrates a DRAM cell that is easier to manufacture than most vertically integrated DRAM cells but has a larger substrate surface area.

The inventive methods, and cell structures presented herein are used to provide a DRAM cell that has reduced surface area, improved short channel transistor behavior, greater storage capacitance than other conventional cells, parallel capacitor cell configurations, and reduced transistor channel length variation. Leakage current in the DRAM cell is reduced due to the fact that transistor first and second current electrodes and transistor channel regions are more isolated from the substrate 12 than conventional planar transistors. A DRAM transistor length is controlled by a conductive layer 30 or conductive layer 42 deposition thickness. The deposition thickness of the conductive layers 30 and 42 ensures that a channel length will be independent from lithography, smaller than lithography allows, and controlled within a smaller variation. The channel width of the DRAM transistor is larger than planar transistors of the same surface area due to the fact that the channel width of a cylindrical transistor is the cylinder's circumference. Due to the smaller channel length and the greater channel width of the transistor, the current carrying capability of the inventive DRAM cell increases without increasing cell surface area.

The DRAM cell taught herein is formed within a contact which is lithographically the smallest feature size in an integrated circuit. In addition, the formation requires few photolithography steps (approximately three to five photolithography sequences) and many features of the inventive transistor can be self-aligned.

Asymmetric transistor source and drain electrodes result and LDD and half LDD transistors are easily formed via in-situ doping or ion implantation. Bulk inversion of the channel region can be achieved for small channel region circumferences. Low off current results and leakage to the substrate is minimized due to the fact that many diffusions are placed in series and isolated from the substrate.

The capacitor has a large capacitive surface area for a small amount of substrate surface area. Due to the fact that the cylindrical conductive region 14 lies within the trench, cylindrical capacitance is greatly increased and surface area is reduced due to optimal vertical placement of the DRAM transistor. The ability to form capacitor/transistor pairs in parallel with minimal loss of surface area results in a flexible DRAM design. In addition, the inventive trench capacitor is more planar than other conventional DRAM capacitors. Furthermore, dielectric layer planarization or a spin on glass can ensure that the inventive DRAM transistor topography is more planar than other conventional DRAM cells.

While the present invention has been illustrated and described with reference to specific embodiments, further modifications and improvements will occur to those skilled in the art. For example, epitaxial growth methods vary in temperature, doping mechanisms, length of time, procedures, and chemistry, and most of these epitaxial processes are capable of forming the source and drain electrodes, capacitor electrodes and channel regions of the inventive DRAM cell. Many applications exist for the inventive capacitor and transistor other than DRAM cells. Many cleaning cycles exist for implementing the described epitaxial growth procedures. Sidewall dielectrics can be formed in one of several ways. Sidewall spacer dielectric formations may also be used to form gate dielectrics. Both N-channel and P-channel transistors and N type or P type capacitor electrodes can be manufactured with the inventive process. Plug technology with polysilicon recrystallization may be used to replace epitaxial growth. For isolation purposes, sidewall oxidation may replace spacers. It is to be understood, therefore, that this invention is not limited to the particular forms illustrated and that it is intended in the appended claims to cover all modifications that do not depart from the spirit and scope of this invention.

We claim:

1. A method for forming a memory cell comprising the steps of:
   providing a substrate having a surface;
   forming a trench region within the substrate, the trench region having a trench sidewall;
   forming a trench sidewall spacer adjacent the trench sidewall;
   forming a conductive region within the trench and laterally adjacent the trench sidewall spacer;
   removing the trench sidewall spacer to expose the trench sidewall and a conductive region sidewall;
   forming a first capacitor electrode laterally adjacent the trench sidewall and laterally adjacent the conductive region sidewall;
   forming a capacitor dielectric region overlying the first capacitor electrode;
   forming a second capacitor electrode overlying the first capacitor electrode, the second capacitor electrode being isolated from the first capacitor electrode by the capacitor dielectric region;
   forming a vertical transistor overlying the first capacitor electrode, the vertical transistor having a first current electrode directly underlying a second current electrode wherein the first current electrode is separated from the second current electrode by a channel region; and
   electrically connecting one of either the first current electrode or the second current electrode to one of either the first capacitor electrode or the second capacitor electrode to form said memory cell.

2. The method of claim 1 wherein the step of forming the conductive region further comprises:
   forming the conductive region by epitaxial growth.

3. The method of claim 1 wherein the step of forming the first capacitor electrode further comprises:
   forming the first capacitor electrode from a material selected from a group consisting of: an epitaxial material, an in-situ doped epitaxial material, a diffused region, and a polysilicon material.

4. A method for forming a transistor comprising the steps of:
   providing a base layer having a surface;
   forming a dielectric layer overlying the base layer, the dielectric layer having an opening which exposes the surface of the base layer;
   forming a first current electrode within the opening and electrically connected to the surface of the base layer;
   forming a channel region overlying the first current electrode and overlying the dielectric layer, the channel region having a channel sidewall that overlies the dielectric layer;
   forming a second current electrode overlying the channel region;
   forming a sidewall dielectric layer laterally adjacent the channel sidewall; and
   forming a control electrode laterally adjacent the sidewall dielectric layer, the control electrode being formed by depositing a layer of polysilicon and planarizing the layer of polysilicon to form the control electrode.

5. The method of claim 4 wherein the steps of forming the first current electrode and the channel region further comprises:
   forming the first current electrode and the channel region by epitaxial growth.

6. The method of claim 4 further comprising the steps of:
   forming a trench capacitor underlying the transistor, the trench capacitor having a first capacitor electrode and a second capacitor electrode; and
   electrically connecting one of either the first current electrode or the second current electrode of the transistor to one of either the first capacitor electrode or the second capacitor electrode.

7. A method for forming a dynamic memory cell comprising the steps of:
   providing a substrate having a surface;
   forming a trench capacitor within the substrate and having an exposed base layer;
   forming a transistor overlying the surface of the substrate and substantially overlying the trench capacitor, the transistor having a first current electrode that substantially overlies a channel region wherein the channel region overlies a second current electrode of the transistor, the transistor being formed by:

forming a first dielectric layer overlying the substrate;

forming a control electrode conductive layer overlying the first dielectric layer;

forming a second dielectric layer overlying the control electrode conductive layer;

removing portions of each of the first dielectric layer, the control electrode conductive layer, and the second dielectric layer to form both an opening which exposes the base layer of the trench capacitor and a sidewall of the control electrode conductive layer;

forming a sidewall dielectric laterally adjacent the sidewall of the control electrode conductive layer; and forming a first conductive region within the opening, the first conductive region having a first portion which functions as a first current electrode, the first portion being laterally adjacent the first dielectric layer and electrically connected to the base layer, the first conductive region having a second portion which functions as a channel region, the second portion being laterally adjacent the sidewall dielectric and overlying the first current electrode, and the first conductive region having a third portion which functions as a second current electrode, the third portion being laterally adjacent the second dielectric layer and overlying the channel region.

8. The method of forming the dynamic memory cell of claim 7 wherein the step of forming the trench capacitor further comprises the steps of:

forming a trench region within the substrate, the trench region having a trench sidewall;

forming a trench sidewall spacer adjacent the trench sidewall;

forming a second conductive region, the second conductive region being within the trench region and laterally adjacent the trench sidewall spacer;

removing the trench sidewall spacer to expose the trench sidewall and a second conductive region sidewall;

forming a first capacitor electrode laterally adjacent the trench sidewall and laterally adjacent the second conductive region sidewall;

forming a capacitor dielectric region overlying the first capacitor electrode; and forming a second capacitor electrode overlying the first capacitor electrode, the second capacitor electrode being isolated from the first capacitor electrode by the capacitor dielectric region.

9. The method of forming the dynamic memory cell of claim 7 further comprising the steps of:

forming a plurality of dynamic memory cells formed wherein each dynamic memory cell in the plurality is laterally adjacent another dynamic memory cell in the plurality, each dynamic memory cell being in accordance with claim 7 and having a first and second capacitor electrode and a first and second transistor current electrode wherein each of the first capacitor electrodes is electrically connected in parallel, each of the second capacitor electrodes is electrically connected to each other, each of the first transistor current electrodes is electrically connected to each other, and each of the second transistor current electrodes is electrically connected to each other.

10. A method for forming a capacitor comprising the steps of:

providing a substrate having a surface;

forming a trench region within the substrate, the trench region having a trench sidewall which lies below the surface of the substrate and a trench bottom surface which lies below the surface of the substrate;

forming a trench sidewall spacer adjacent the trench sidewall;

forming a conductive region within the trench and laterally adjacent the trench sidewall spacer by using a selective growth process, the conductive region being electrically coupled to the trench bottom surface and having a sidewall which is laterally adjacent the trench sidewall spacer;

removing the trench sidewall spacer to expose the trench sidewall and the conductive region sidewall;

forming a first capacitor electrode laterally adjacent the trench sidewall, adjacent the trench bottom surface, and laterally adjacent the conductive region sidewall, the first capacitor electrode being at least partially formed below the surface of the substrate;

forming a capacitor dielectric region overlying the first capacitor electrode; and forming a second capacitor electrode overlying the first capacitor electrode, the second capacitor electrode being isolated from the first capacitor electrode by the capacitor dielectric region and being at least partially formed below the surface of the substrate.

11. The method of claim 10 wherein the step of forming the conductive region further comprises:

forming the conductive region by epitaxial growth.

12. The method of claim 10 wherein the step of forming the first capacitor electrode further comprises:

forming the first current electrode from a material selected from a group consisting of: an epitaxial material, an in-situ doped epitaxial material, a diffused region, and a polysilicon material.

13. The method of claim 10 further comprising the steps of:

forming a planar transistor laterally adjacent the capacitor, the planar transistor having a gate electrode, a channel region underlying the gate electrode, a first current electrode laterally adjacent the channel region, and a second current electrode laterally adjacent the channel region and physically separated from the first current electrode by the channel region; and electrically connecting one of either the first current electrode or the second current electrode to one of either the first capacitor electrode or the second capacitor electrode.

14. The method of claim 10 further comprising the steps of:

forming a vertical transistor overlying the capacitor, the vertical transistor having a first current electrode directly underlying a second current electrode wherein the first current electrode is separated from the second current electrode by a channel region; and electrically connecting one of either the first current electrode or the second current electrode to one of either the first capacitor electrode or the second capacitor electrode.

15. The method of claim 10 wherein a transistor is formed adjacent the capacitor by a method which comprises the steps of:
- providing a base layer having a surface;
- forming a dielectric layer overlying the base layer, the dielectric layer having an opening which exposes the surface of the base layer;
- forming a first current electrode within the opening and electrically connected to the surface of the base layer;
- forming a channel region overlying the first current electrode and overlying the dielectric layer, the channel region having a channel sidewall that overlies the dielectric layer;
- forming a second current electrode overlying the channel region;
- forming a sidewall dielectric layer laterally adjacent the channel sidewall; and
- forming a control electrode laterally adjacent the sidewall dielectric layer.

16. The method of claim 15 wherein the steps of forming the first current electrode and the channel region further comprise:
- forming the first current electrode and the channel region by epitaxial growth.

17. The method of claim 15 wherein the step of forming a control electrode further comprises:
- forming the control electrode by depositing a layer of polysilicon and planarizing the layer of polysilicon to form the control electrode.

18. The method of claim 15 further comprising the step of:
- electrically connecting one of either the first current electrode or the second current electrode of the transistor to one of either the first capacitor electrode or the second capacitor electrode.

* * * * *